United States Patent [19]
Yasuda et al.

[11] Patent Number: 4,585,943
[45] Date of Patent: Apr. 29, 1986

[54] ELECTRON BEAM EXPOSURE APPARATUS

[75] Inventors: Hiroshi Yasuda; Haruo Tsuchikawa, both of Yokohama, Japan

[73] Assignee: Fujitsu Limited, Kawasaki, Japan

[21] Appl. No.: 502,571

[22] Filed: Jun. 9, 1983

[30] Foreign Application Priority Data

Jun. 11, 1982 [JP] Japan ................. 57-100422

[51] Int. Cl.$^4$ ............................................. H01J 37/00
[52] U.S. Cl. ........................ 250/396 R; 250/396 ML
[58] Field of Search .................... 250/310, 311, 396 R, 250/396 ML, 398, 497.2

[56] References Cited

U.S. PATENT DOCUMENTS 4,125,772 11/1978 Holmes ................. 250/396 ML
4,362,942 12/1982 Yasuda ................. 250/398

Primary Examiner—Bruce C. Anderson
Attorney, Agent, or Firm—Staas & Halsey

[57] ABSTRACT

An electron beam exposure apparatus having a control apparatus wherein the positioning error caused by transient response characteristics of an electron beam deflection device is detected by using a knife-edge type gauge and a reflecting electron detector. A compensation signal to compensate for the positioning error is produced in a compensation device, and the compensation signal is applied to the electron beam deflection device, whereby the deviation of the position of the electron beam, from the normal position, caused by the transient response characteristics, is reduced.

4 Claims, 10 Drawing Figures

ELECTRON BEAM EXPOSURE APPARATUS

BACKGROUND OF THE INVENTION

(1) Field of the Invention

The present invention relates to an electron beam exposure apparatus, more particularly to an electron beam exposure apparatus having a control apparatus wherein transient response characteristics of an electromagnetic deflection means do not cause positioning errors of the electron beam.

(2) Description of the Prior Art

In the past, electron beam exposure has been effected by scanning a very small diameter electron beam along a certain pattern. Recently, a new electron beam exposure method has been developed in which two plates having rectangular apertures are arranged in the electron beam path and a deflection means, located between the plates, is used to control the passage of the electron beam therethrough, thereby obtaining an electron beam of any desired rectangular area. This new method has significantly reduced the time required for exposure and can be computer controlled.

In electron beam scanning, only the sections requiring exposure are scanned. This scanning method offers excellent scanning efficiency, but also has the disadvantage that the transient response characteristics of the deflection means, due to eddy current or the like, causes positioning errors of the electron beam.

Such transient response characteristic positioning errors occur when the magnetic material around the deflection coil for the electron beam has a memory function. More specifically, fluctuations of the deflecton speed of the electron beam occur, and the irradiation point of the electron beam moves to a point different than the desired one. For this reason, various attempts have been made to reduce positioning errors.

Up until now, it has only been possible to scan an area of several square millimeters at one time by an electron beam, even with an electron beam exposure apparatus using an electron beam having a rectangular section. Therefore, when a silicon wafer 1 has several hundred to several thousand chips 2, as shwn in FIG. 1, the silicon wafer 1 is mechanically moved in an LX direction and an LY direction by an XY stage for irradiation. Recently, it has become possible to scan a chip area of approximately 10 mm × 10 mm ($l_x \times l_y$) without moving the XY stage. Further, sometimes a beam 3 is moved to an adjacent chip, i.e., a subfield, a beam 3 is jumped one or two subfields which do not have to be irradiated, or a beam 3 is moved to a subfield considerably distant from a previous position. The scanning in each subfield is performed using an electrostatic deflection means of the electron beam exposure apparatus and the deflection of the electron beam from one subfield to another is performed using an electromagnetic deflection means.

During deflection between subfields by an electromagnetic deflection means, a heavy current is applied to electromagnetic deflection coils in order to move the electron beam a longer distance. This creates an eddy current in the metals around the deflection means and in wires of the deflection coils. As shown in FIG. 2, in the absence of an eddy current, the electron beam would move from a center A of a first subfield 2a to a center C of a third subfield 2c jumping over a second subfield 2b. In the presence of an eddy current, the electron beam is moved to a point C' by the change of deflection speed and an error e appears.

To reduce the error, litz wire, which comprises numerous fine wires twisted together, has been used as the electromagnetic deflection coils to decrease the eddy current effect. Also, as shown in FIG. 3, the inner wall 4 of an electron lens has been made of a magnetic material such as ferrite. These efforts have improved the electromagnetic and electrostatic deflection of the electron beam 7 to reach through an aperture 4a and through the centers of the electromagnetic deflection coils 5 and electrostatic deflector 6 to accurately enable predetermined positioning of the wafer 1 on an XY stage 8.

Such mechanical improvements, however, have not been able to completely eliminate error. Therefore, to prevent the eddy current in the deflection coils from having a detrimental effect, it is necessary to provide an idle time until the eddy current disappears. The thousands or tens of thousands of idle times increase the exposure time required for one wafer.

SUMMARY OF THE INVENTION

An object of the present invention is to provide an electron beam exposure apparatus having a control apparatus which electrically compensates for the irradiation positioning error of an electron beam caused by transient response characteristics of an electron beam deflection means and, thus, reduce the position deviation of the electron beam from the normal position.

According to an aspect of the present invention, there is provided an electron beam exposure apparatus for selectively exposing, with an electron beam, a desired area of a medium to be processed, including an electron emitting means for emitting an electron beam; a control means for providing a deflection signal; a deflection means for deflecting, in response to the deflection signal, the electron beam, to expose the desired area of the medium; and compensation signal generating means for providing, in response to the deflection signal, a compensation signal to the deflection means to compensate for a position error of the electron beam due to an eddy current generated in the apparatus, in accordance with the deflection signal.

DESCRIPTION OF THE PREFERRED EMBODIMENTS

Figure 1:
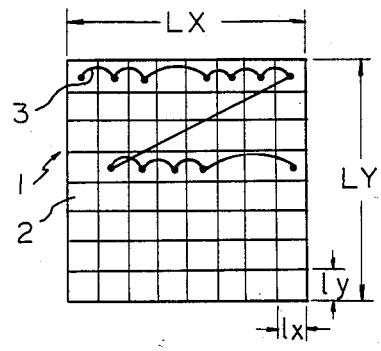
FIG. 1 is a plan view of a prior art wafer showing a electron beam locus when the electron beam jumps over chips of the wafer.
Figure 2:
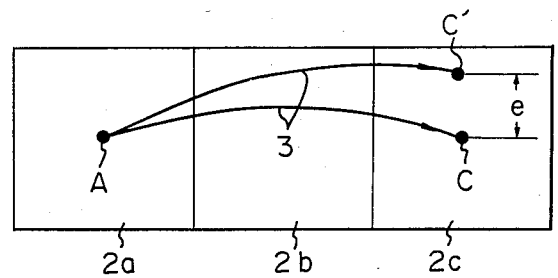
FIG. 2 is a plan view of chips showing a positioning error of an electron beam when the electron beam jumps over one of the chips.
Figure 3:
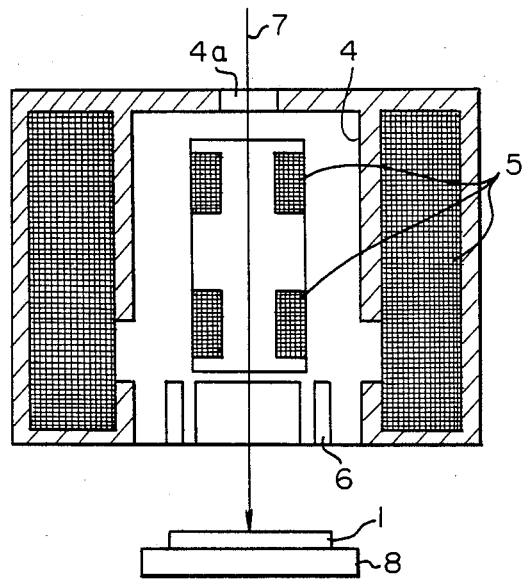
FIG. 3 is a side sectional view of a main deflection means in a conventional electron beam exposure apparatus.
Figure 4:
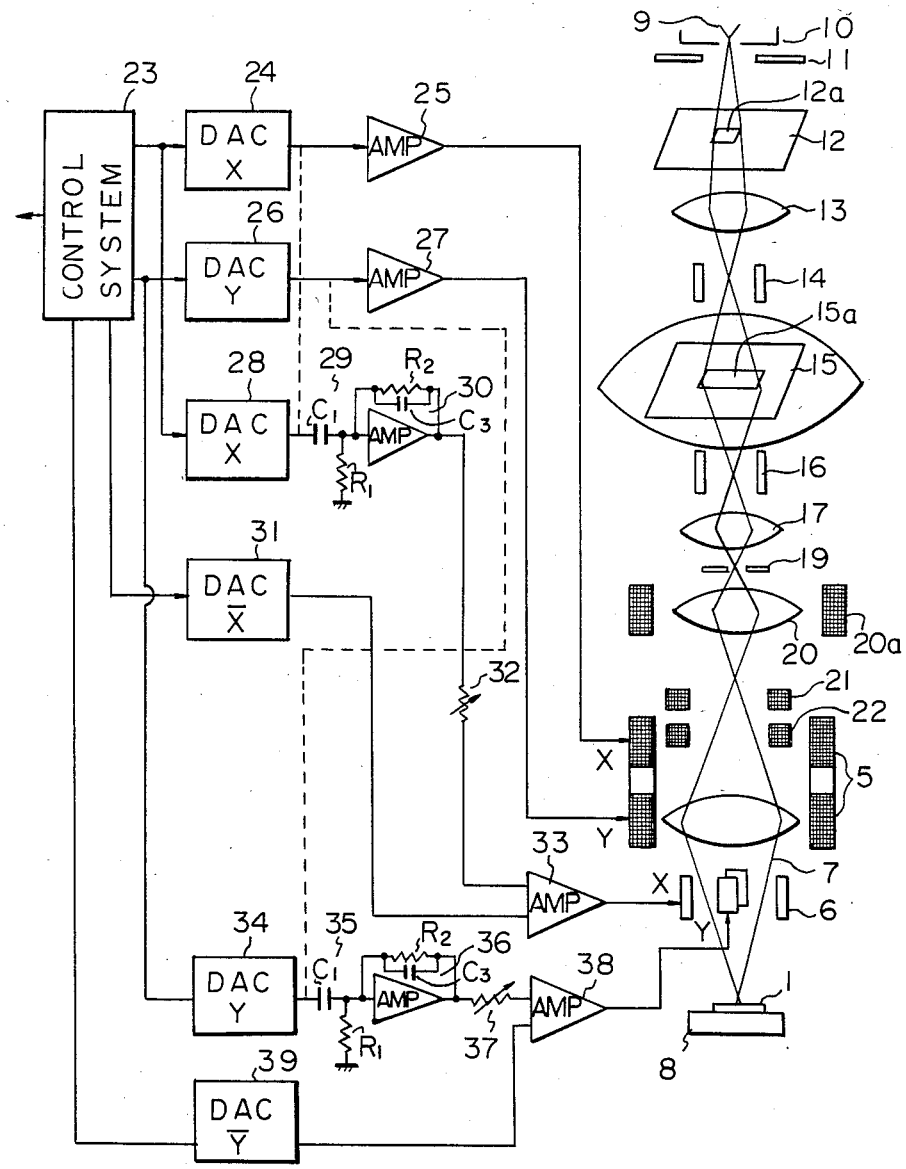
FIG. 4 is a block circuit diagram of an electron beam exposure apparatus according to a first embodiment of the present invention.

Embodiments of the present invention will be explained with reference to the drawings. FIG. 4 is a block circuit diagram of an electron beam exposure apparatus according to a first embodiment of the present invention. In the schematic drawing, to the right, an electron beam 7 emitted from a beam source, i.e., a cathode 9, irradiates a first mask 12 having a first rectangular aperture 12a through a grid 10 and an anode 11. The electron beam 7, which has been given a rectangular section by the rectangular aperture 12a, irradiates a second mask 15 through a first focusing lens 13 at a position deflected from a second rectangular aperture 15a by a variable rectangular deflection means 14 controlled by an electronic computer. The electron beam 7 passes through a blanking electrode 16, a third lens system 17, a circular aperture 19, and a fourth lens system 20 comprising a dynamic refocus coil 20a driven by changes in the beam size. The electron beam 7 further passes through a dynamic focus coil 21 arranged at the preceding stage of a deflection means 5, e.g., electromagnetic main deflection coils, and a dynamic stigmator coil 22. The dynamic focus coil 21 and dynamic stigmator coil 22 are supplied with drive signals corresponding to the change of the deflecting position. The electron beam 7 passing through the main deflection coil 5 irradiates a wafer 1 through an electrostatic subdeflection means 6.

In the figure, the main deflection coil for the Y axis is shown along side the main deflection coil for the X axis. In actuality, however, the pair of coils Y are arranged perpendicular to the pair of coils X at the same level.

The main deflection means 5 is mainly used for deflection scanning of main fields on a wafer. The electrostatic subdeflector 6 is used for deflection scanning of subfields on the chips and the like.

Turning now to the electron beam control apparatus, a control system 23 is connected to a computer. Deflection data from the control system 23 is supplied to a first digital-to-analog (D/A) converter for the X axis DACX 24 and a first D/A converter for the Y axis DACY 26. The analog deflection signals from DACX 24 and DACY 26 are supplied to the coils for the X axis and Y axis of the main deflection means 5 through amplifiers 25 and 27, respectively.

In this embodiment, in order to compensate for the transient response characteristics of the deflection means, deflection pulses from the control system 23 are converted to analog signals through a third D/A converter for the X axis DACX 28 and a third D/A converter for the Y axis DACY 34. The values of a time constant $R1 \times C1$, of differential circuits 29 and 35 comprising capacitors C1 and resistors R1, and the capacitors C3 determining the rising times of amplifier circuits 30 and 36 are selected so as to cancel the effects of transient response characteristics on the metals, including iron, and magnetic materials near the deflection means or the wire of the deflection coil. When the inner wall of the lens in the main deflection means 5 is made of metal, the value of the time constant should be selected to be between several tens to hundreds of microseconds.

The signal obtained from the differential circuit 29 is supplied to an adding amplifier circuit 33 through the amplifier circuit 30 and a variable resistor 32 for adjusting the signal level. The signal from the differential circuit 35 is supplied to an adding amplifier circuit 38 through the amplifier circuit 36 and a variable resistor 37 for adjusting the signal level. Also, the analog output from a second D/A converter DAC$\overline{X}$ 31 is supplied to the adding amplifier circuit 33, and the analog output from a second D/A converter DAC$\overline{Y}$ 39 is supplied to the adding amplifier circuit 38. The output of the adding amplifier circuit 33 is supplied to the electrodes for the X axis of the electrostatic subdeflector 6. The output of the adding amplifier circuit 38 is supplied to the electrodes for the Y axis of the electrostatic subdeflector 6.

In this embodiment, DACX 28 and DACY 34 are provided along with DACX 24 and DACY 26, however, it is possible to omit DACX 28 and DACY 34 and to supply the analog signals from DACX 24 and DACY 26 to the differential circuits 29 and 35, respectively, as shown by the dotted lines in FIG. 4. Further, the outputs of the differential circuits may be supplied to only one of the electrodes of the X axis or Y axis of the subdeflector 6.

Figure 5:
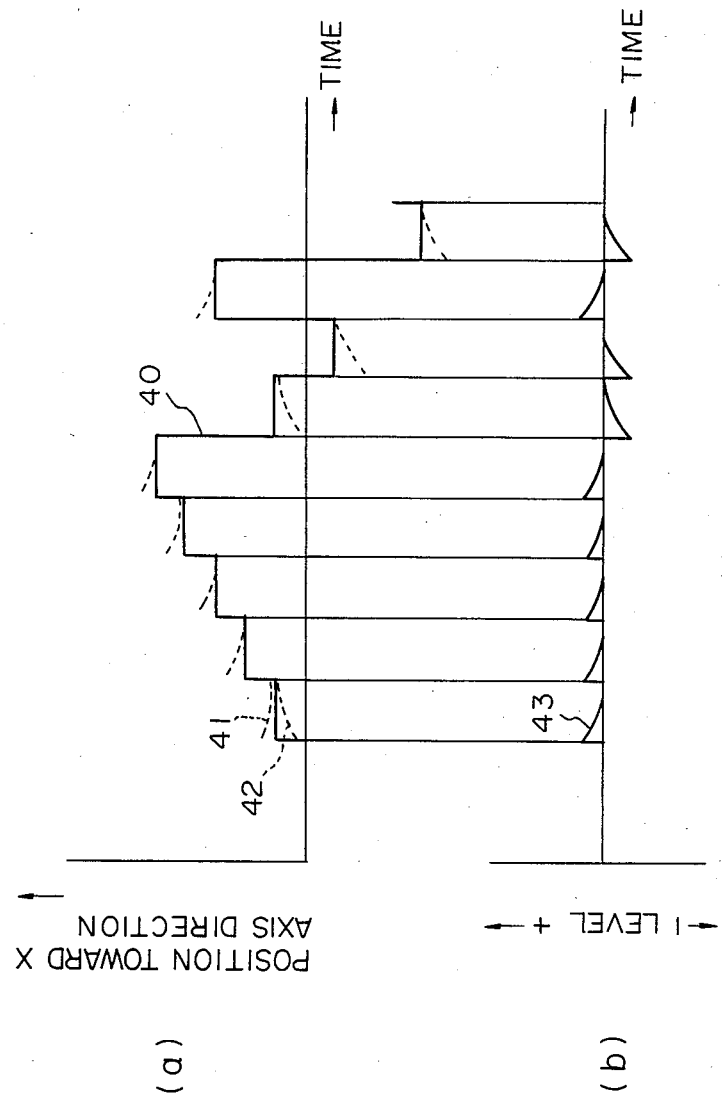
FIGS. 5(a) and (b) are waveform diagrams for the apparatus of FIG. 4.

Suppose that, in the above-mentioned apparatus, the electron beam 7 is deflected on the subfield of the wafer 1 corresponding to the chip 2 and jumps over several chips. As shown in FIG. 5(a), if the electron beam 7 should move to the position indicated by line 40 in the X axis direction, then the electron beam 7 actually deviates due to an eddy current or the like to a position of an overshoot curve 41 or undershoot curve 42. Thus, the analog signals from DACX 28 and DACY 34 are applied to the differential circuits 29 and 35, respectively. The output of the differential circuit having the waveform 43 as shown in FIG. 5(b), including the signals of the above deviations, is obtained sequentially and is applied to the main deflection means or the subdeflector along with the compensation signal. Thus, the positioning error of the electron beam is cancelled.

Figure 6:
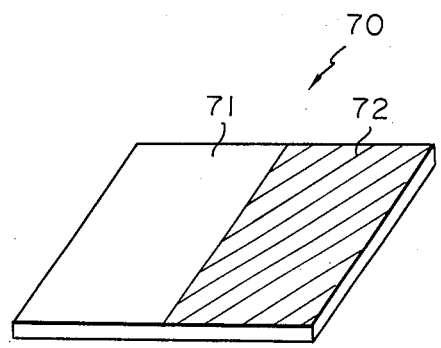
FIG. 6 is a perspective view of a knife-edge type gauge used in the apparatus of FIG. 4.

Below, the determination of each value of the circuit elements in the differential circuit and the amplifier circuit is described. First, instead of the silicon wafer to be processed, a knife-edge type gauge 70 is placed on the XY stage 8, as shown in FIG. 6. The gauge 70 comprises a silicon material upon which is deposited a metal, e.g., tantalum or gold. A portion 72 upon which metal is deposited and a portion 71 upon which no metal is deposited are divided near the center by a straight line. The above materials need not necessarily be used as long as the gauge 70 comprises materials having greatly different reflection ratios.

Figure 7:
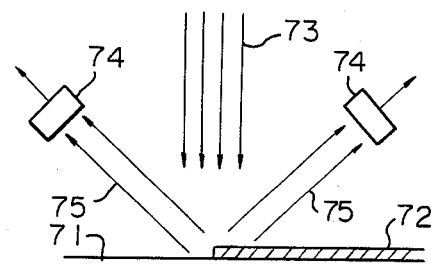
FIG. 7 is a side view of the knife-edge type gauge, showing the detection of reflected electrons.

When an electron beam of a predetermined cross-sectional area moves in the X axis direction and stops near the boundary of the two materials of the gauge 70, the fluctuation of the position irradiated by the electron beam is detected as an output by a reflecting electron detector 74 provided in the apparatus (FIG. 7). If the metal portion irradiated by the electron beam is large, many reflected electrons 75 are generated, while if the non-metal portion irradiated by the electron beam is small, few reflected electrons 75 are generated. Therefore, the change of the output of the reflecting electron detector 74 enables detection of the fluctuation of the position irradiated by the electron beam.

The values of the capacitors C1 and C3, resistor R1, and variable resistor 32 are adjusted so as to eliminate the electron beam deviation caused by the transient response characteristics using the above-mentioned gauge 70. Thus, the determination of the values C1 and R1 of the elements in the differential circuit 29, the determination of the rising time characteristics of the capacitor C3 in the amplifier circuit 30, and the signal level adjustment by the variable resistor 32 can be performed.

The values of the capacitors C1 and C3, the resistor R1 in the differential circuit 35 and the amplifier circuit 36 and the variable resistor 37 are obtained by a similar adjustment moving the electron beam in the Y axis direction and the position of the gauge 70 is rotated by 90 degrees from the position for the X axis adjustment.

Figure 8:
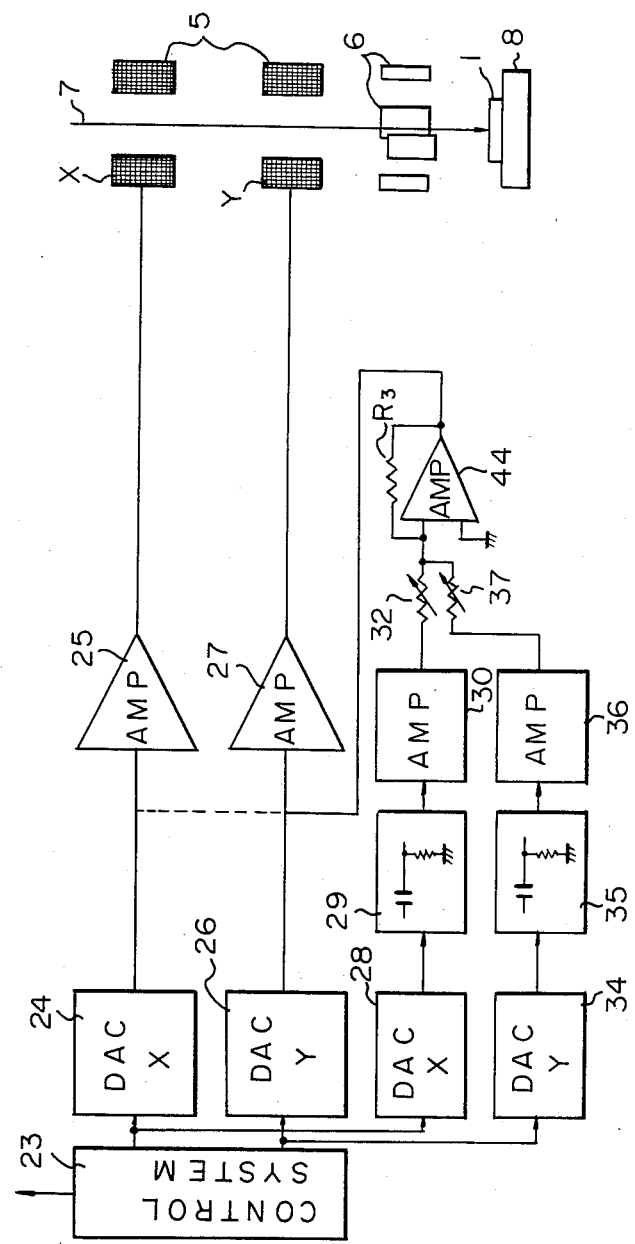
FIG. 8 is a block circuit diagram of an electron beam exposure apparatus according to a second embodiment of the present invention.

In FIG. 8, a second embodiment of the present invention is shown. Elements the same as in the embodiment of FIG. 4 are indicated with the same reference numerals and are not explained again. The analog signals from DACX 28 and DACY 34 are converted to differential values through the differential circuits 29 and 35, are amplified through the amplifier circuits 30 and 36, adjusted in level through the variable resistors 32 and 37 to a predetermined voltage level, and are applied to the adding amplifier circuit 44, respectively. The output of the adding amplifier circuit 44 is applied to the input of the amplifier circuit 25 or 27 for the main deflection means 5. Of course, the outputs of amplifier circuits 30 and 36 may be adjusted properly and may be added individually to the inputs of the amplifier circuit 25 for the X axis and the amplifier circuit 27 for the Y axis, for driving the main deflection means 5.

Figure 9:
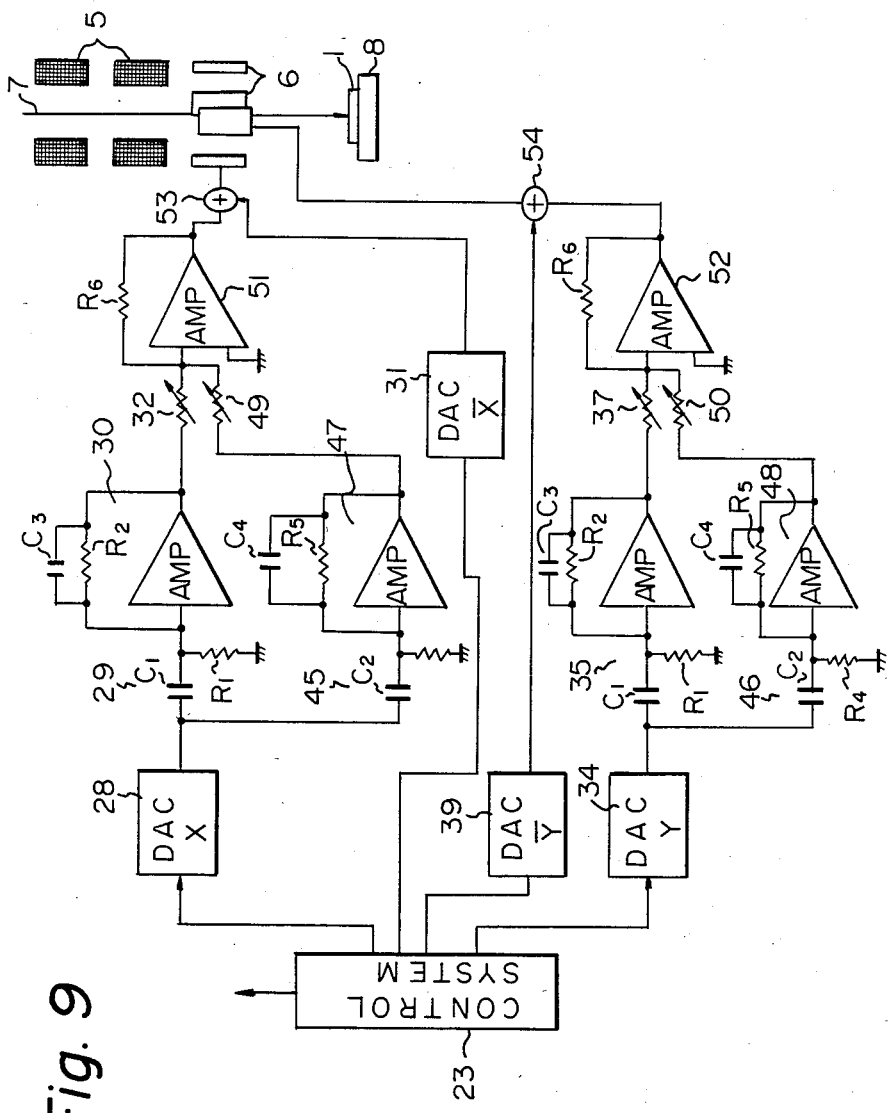
FIG. 9 is a block circuit diagram of an electron beam exposure apparatus according to a third embodiment of the present invention.

In FIG. 9, a third embodiment of the present invention is shown for a case where the inner walls of the deflection means are made of magnetic materials effect of the eddy current in the deflection coil itself is small, i.e., the time constant is 3 to 5 milliseconds. Other differential circuits 45 and 46, having a short time constant, are connected in parallel with the differential circuits 29 and 35 at the rear stage of DACX 28 and DACY 34, respectively. The time constant $C2 \times R4$ is selected to be 2 to 3 milliseconds.

The outputs of the differential circuits 45 and 46 are amplified through amplifier circuits 47 and 48, respectively. The outputs of the amplifier circuits 47 and 48 are added to the outputs of the amplifier circuits 30 and 36, respectively. The added ououts are amplified to adjust the output level by adjusting amplifier circuits 51 and 52. The outputs of the adjusting amplifier circuits 51 and 52 are added to the outputs of $\overline{\text{DACX}}$ 31 and $\overline{\text{DACY}}$ 39 at adders 53 and 54, respectively. The outputs of the adders 53 and 54 are applied to an X-axis electrode and Y-axis electrode of the subdeflector 6, respectively. Thus, the positioning error of the electron beam irradiation caused by transient response characteristics is compensated.

Figure 10:
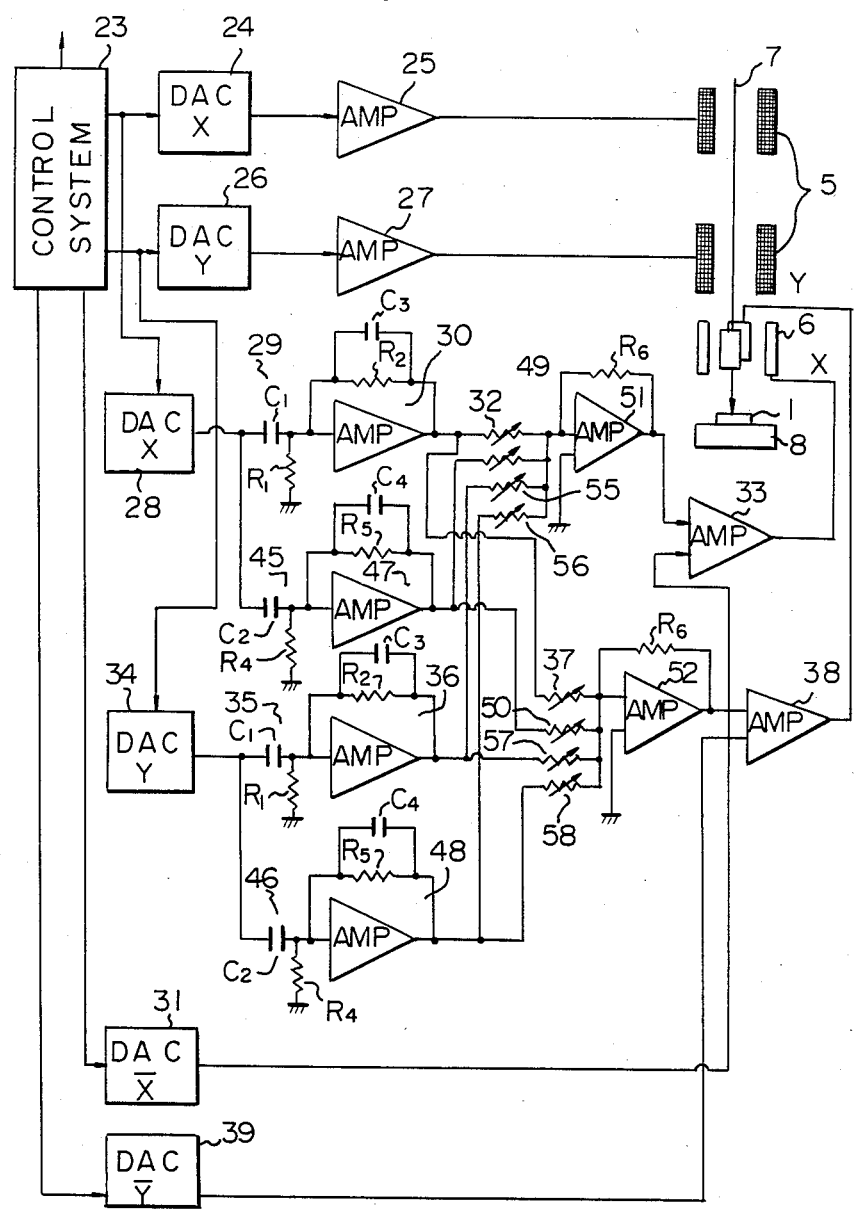
FIG. 10 is a block circuit diagram of an electron beam exposure apparatus according to a fourth embodiment of the present invention.

In FIG. 10, a fourth embodiment of the present invention is shown. In this embodiment, the analog signal from DACX 28 is applied to two differential circuits 29 and 45 having different time constants. The outputs of the differential circuits 29 and 45 are amplified by amplifier circuits 30 and 47, respectively. The analog signal from DACY 34 is applied to two differential circuits 35 and 46 having different time constants. The outputs of the differential circuits 35 and 46 are amplified by amplifier circuits 36 and 48, respectively. The summation of all the outputs of the amplifier circuits 30, 47, 36, and 48 is applied to the adjusting amplifier circuits 51 and 52. The outputs of the adjusting amplifier circuits 51 and 52 are added to the outputs of $\overline{\text{DACX}}$ 31 and $\overline{\text{DACY}}$ 39 at adding amplifier circuits 33 and 38, respectively. Thus, the outputs of the adding amplifier circuits 33 and 38 are applied to the X-axis electrode and Y-axis electrode of the subdeflector 6, respectively.

In the second to fourth embodiments of the present invention, the determination of the values of the elements of the differential circuits and the amplifier circuits can be performed with the gauge 70 just as in the first embodiment.

We claim:

1. An electron beam exposure apparatus for selectively exposing a desired area of a medium to be processed with an electron beam, comprising:
   electron emitting means for emitting the electron beam;
   control means for providing a first digital signal and a second digital signal, the position on the medium where the electron beam is irradiated being determined by the first and second digital signals;
   deflection means, operatively connected to said control means, for deflecting the electron beam, in response to the first and second digital signals, so as to expose the desired area of the medium, said deflection means comprising electromagnetic deflection means and electrostatic deflection means, a first analog signal, corresponding to the first digital signal, being supplied to said electromagnetic deflection means and a second analog signal, corresponding to the second digital signal, being supplied to said electrostatic deflection means; and
   compensation signal generating means, operatively connected to said deflection means, for receiving the first analog signal and supplying a compensation signal, in accordance with the first analog signal, to said electromagnetic deflection means to compensate for a position error of the electron beam on the medium due to an eddy current generated in said electron beam exposure apparatus, said compensation signal generating means including:
   a digital to analog converter, operatively connected to said control means, for providing the first and second analog signals in response to the first and second digital signals, respectively; and
   a first differential circuit, operatively connected to said digital to analog converter, for providing the compensation signal in response to the first analog signal.

2. An apparatus as defined in claim 1, wherein the desired medium has main fields and subfields and wherein said deflection means comprises:
   main deflection means, operatively connected to said differential circuit, for deflection scanning the main fields; and
   subdeflector means, operatively connected to said digital to analog converter, for deflection scanning the subfields.

3. An apparatus as defined in claim 1, wherein said compensation signal generating means further comprises a second differential circuit operatively connected in parallel with said first differential circuit.

4. An apparatus as defined in claim 3, wherein said first and second differential circuits have different time constants and wherein said compensation signal generating means further comprises adjusting amplifiers operatively connected to said first and second differential circuits.

* * * * *

UNITED STATES PATENT AND TRADEMARK OFFICE
CERTIFICATE OF CORRECTION

PATENT NO. : 4,585,943

DATED : April 29, 1986

INVENTOR(S) : Hiroshi Yasuda et al

It is certified that error appears in the above-identified patent and that said Letters Patent is hereby corrected as shown below:

Column 1, line 44, "shwn" should be -- shown --.

Column 2, line 2 "e" should be -- $\underline{e}$ --.

Column 5, line 35, "effect" should be -- or the effect --.

Signed and Sealed this

Twelfth Day of August 1986

[SEAL]

Attest:

DONALD J. QUIGG

Attesting Officer

Commissioner of Patents and Trademarks